(12) United States Patent
Hazel et al.

(10) Patent No.: US 11,795,829 B2
(45) Date of Patent: Oct. 24, 2023

(54) REACTIVE THERMAL BARRIER COATING

(71) Applicant: Raytheon Technologies Corporation, Farmington, CT (US)

(72) Inventors: Brian T. Hazel, Avon, CT (US); Elisa M. Zaleski, Manchester, CT (US); Kaylan M. Wessels, West Hartford, CT (US)

(73) Assignee: RTX Corporation, Farmington, CT (US)

( * ) Notice: Subject to any disclaimer, the term of this patent is extended or adjusted under 35 U.S.C. 154(b) by 416 days.

(21) Appl. No.: 16/906,298

(22) Filed: Jun. 19, 2020

(65) Prior Publication Data

US 2020/0400028 A1 Dec. 24, 2020

Related U.S. Application Data

(60) Provisional application No. 62/864,624, filed on Jun. 21, 2019.

(51) Int. Cl.
*C23C 28/00* (2006.01)
*C23C 4/134* (2016.01)
(Continued)

(52) U.S. Cl.
CPC .............. *F01D 5/282* (2013.01); *B32B 15/04* (2013.01); *B32B 18/00* (2013.01); *C23C 4/11* (2016.01);
(Continued)

(58) Field of Classification Search
CPC ........ F01D 25/005; F01D 25/08; F01D 5/282; F01D 5/288; F01D 5/284; F01D 5/28; B32B 15/04; B32B 18/00; C23C 14/06; C23C 14/08; C23C 14/081; C23C 14/082; C23C 14/083; C23C 14/086; C23C 14/088; C23C 14/22; C23C 14/28; C23C 14/30; C23C 14/34; C23C 14/3492; C23C 4/11; C23C 4/134; C23C 4/18; C23C 16/40; C23C 16/405; C23C 16/45525;
(Continued)

(56) References Cited

U.S. PATENT DOCUMENTS 6,296,945 B1 10/2001 Subramanian
9,920,417 B2 3/2018 Porob et al.
(Continued)

FOREIGN PATENT DOCUMENTS

EP 3453779 A1 3/2019
EP 3453784 A1 3/2019

OTHER PUBLICATIONS

Extended European Search Report for EP Application No. 20180747.6, dated Sep. 14, 2020, 7 pages.

*Primary Examiner* — Michael E. La Villa
(74) *Attorney, Agent, or Firm* — Kinney & Lange, P.A.

(57) ABSTRACT

A calcium-magnesium-alumino-silicate (CMAS)-reactive thermal barrier coating includes a ceramic coating and a CMAS-reactive overlay coating, wherein the CMAS-reactive overlay coating conforms to a surface of the ceramic coating and comprises a compound that forms a stable high melting point crystalline precipitate when reacted with molten CMAS at a rate that is competitive with CMAS infiltration kinetics into the thermal barrier coating. The ceramic coating phase is stable with the CMAS-reactive overlay coating.

8 Claims, 2 Drawing Sheets

(51) Int. Cl.
| | |
|---|---|
| *F01D 5/28* | (2006.01) |
| *F01D 25/00* | (2006.01) |
| *F01D 25/08* | (2006.01) |
| *C23C 28/04* | (2006.01) |
| *C23C 14/30* | (2006.01) |
| *C23C 14/08* | (2006.01) |
| *B32B 15/04* | (2006.01) |
| *C23C 16/455* | (2006.01) |
| *C23C 16/40* | (2006.01) |
| *B32B 18/00* | (2006.01) |
| *C23C 4/11* | (2016.01) |
| *C23C 4/18* | (2006.01) |
| *C23C 14/28* | (2006.01) |
| *C23C 14/34* | (2006.01) |
| *C23C 14/06* | (2006.01) |
| *C23C 14/22* | (2006.01) |
| *C23C 30/00* | (2006.01) |

(52) U.S. Cl.
CPC .............. *C23C 4/134* (2016.01); *C23C 4/18* (2013.01); *C23C 14/06* (2013.01); *C23C 14/08* (2013.01); *C23C 14/081* (2013.01); *C23C 14/082* (2013.01); *C23C 14/083* (2013.01); *C23C 14/086* (2013.01); *C23C 14/088* (2013.01); *C23C 14/22* (2013.01); *C23C 14/28* (2013.01); *C23C 14/30* (2013.01); *C23C 14/34* (2013.01); *C23C 14/3492* (2013.01); *C23C 16/40* (2013.01); *C23C 16/405* (2013.01); *C23C 16/409* (2013.01); *C23C 16/45525* (2013.01); *C23C 28/04* (2013.01); *C23C 28/042* (2013.01); *C23C 28/30* (2013.01); *C23C 28/3215* (2013.01); *C23C 28/345* (2013.01); *C23C 28/3455* (2013.01); *C23C 30/00* (2013.01); *C23C 30/005* (2013.01); *F01D 5/28* (2013.01); *F01D 5/284* (2013.01); *F01D 5/288* (2013.01); *F01D 25/005* (2013.01); *F01D 25/08* (2013.01); *C04B 2237/34* (2013.01); *C04B 2237/343* (2013.01); *C04B 2237/348* (2013.01); *Y10T 428/1259* (2015.01); *Y10T 428/12597* (2015.01); *Y10T 428/12611* (2015.01); *Y10T 428/12618* (2015.01); *Y10T 428/2495* (2015.01); *Y10T 428/24967* (2015.01); *Y10T 428/265* (2015.01)

(58) Field of Classification Search
CPC ..... C23C 16/409; C23C 28/04; C23C 28/042; C23C 28/3215; C23C 28/3455; C23C 28/30; C23C 28/345; C23C 30/00; C23C 30/005; C04B 2237/34; C04B 2237/343; C04B 2237/348; Y10T 428/1259; Y10T 428/12597; Y10T 428/12611; Y10T 428/12618; Y10T 428/24967; Y10T 428/2495; Y10T 428/265
See application file for complete search history.

(56) References Cited

U.S. PATENT DOCUMENTS

| | | | |
|---|---|---|---|
| 10,179,945 | B2 | 1/2019 | Rosenzweig et al. |
| 2008/0113095 | A1* | 5/2008 | Gorman .............. C23C 4/18 427/404 |
| 2013/0196141 | A1* | 8/2013 | Vassen .............. B28B 19/00 427/255.12 |
| 2018/0119270 | A1 | 5/2018 | Hoel et al. |

* cited by examiner

REACTIVE THERMAL BARRIER COATING

CROSS-REFERENCE TO RELATED APPLICATION(S)

This application claims the benefit of U.S. Provisional Application No. 62/864,624 filed Jun. 21, 2019 for "REACTIVE THERMAL BARRIER COATING" by B. Hazel, E. Zaleski, and K. Wessels.

BACKGROUND

The present disclosure relates generally to coatings and more particularly to reactive thermal barrier coatings (TBCs).

TBCs are conventionally applied to components of gas turbine engines exposed to high temperatures and/or environmental contaminants to protect and extend the life of the components. TBCs can help inhibit oxidation, corrosion, erosion, and other environmental damage to the underlying substrate. During operation, TBCs can be susceptible to damage by environmental dust and debris, including calcium-magnesium-alumino-silicate (CMAS) contaminants. At elevated temperatures, CMAS can melt and infiltrate the porous TBC, which can reduce the strain tolerance of the TBC and promote spallation. The degradation of TBCs is becoming a growing concern as operating temperatures are increased to improve engine efficiency. New and advanced TBCs with improved durability at increasing temperatures are needed.

SUMMARY

A calcium-magnesium-alumino-silicate (CMAS)-reactive thermal barrier coating includes a ceramic coating and a CMAS-reactive overlay coating. The CMAS-reactive overlay coating conforms to a surface of the ceramic coating and comprises a compound that forms a stable high melting point crystalline precipitate when reacted with molten CMAS at a rate that is competitive with CMAS infiltration kinetics into the thermal barrier coating. The ceramic coating phase is stable with the CMAS-reactive overlay coating.

The present summary is provided only by way of example, and not limitation. Other aspects of the present disclosure will be appreciated in view of the entirety of the present disclosure, including the entire text, claims and accompanying figures.

Figure 1:
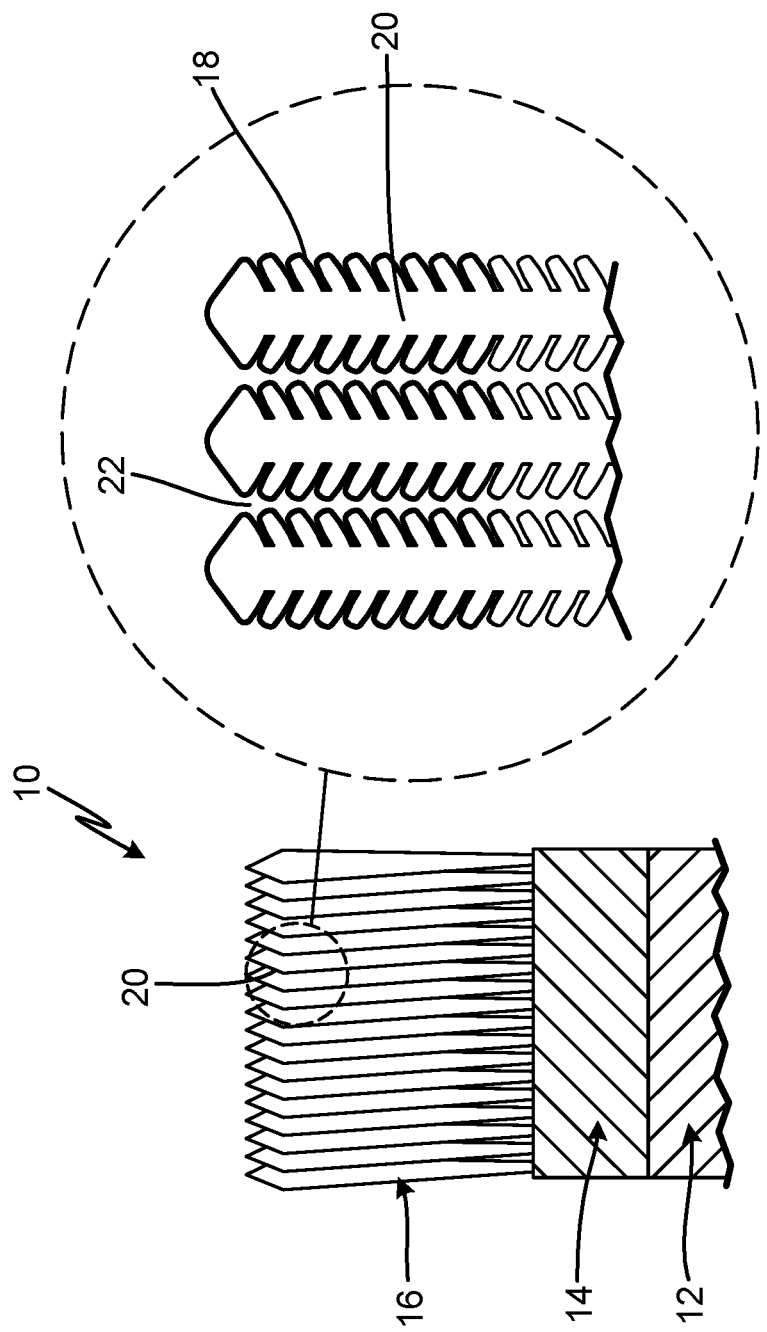
FIG. 1 is a schematic cross-sectional view of one embodiment of a coating.

While the above-identified figures set forth embodiments of the present invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features, steps and/or components not specifically shown in the drawings.

DETAILED DESCRIPTION

Thermal barrier coatings (TBCs) are conventionally applied to components of gas turbine engines exposed to high temperatures and/or environmental contaminants to protect and extend the life of the components. Conventional TBCs are porous, compliant structures with high strain tolerance. The strain tolerance can be reduced when TBC surface temperatures exceed the melting point (approximately 2200° F.) of ingested calcium magnesium-aluminosilicate (CMAS) materials—a temperature that is commonly exceeded on the TBC surface in modern gas turbine engines. Due to its low viscosity, the molten CMAS material can penetrate the TBC, thereby densifying and reducing the compliance of the TBC. The current state-of-the art CMAS-resistant TBC material is gadolinium zirconate (GDZ). The gadolinium in the GDZ reacts with CMAS to precipitate an apatite material. The reaction occurs quickly allowing the apatite reaction product to seal the remainder of the TBC from direct contact with the molten CMAS. Time and temperature increase the rate of attack and therefore improvements beyond GDZ are needed for future higher surface temperature TBC uses.

The rate limiting step in the GDZ-CMAS reaction is the dissolution rate of gadolinium from the GDZ in a sufficient concentration to react with CMAS. The dissolution time translates directly to the dissolution depth within the TBC layer. The present disclosure is directed to a TBC with a concentrated rare earth overlay, which provides a CMAS reactive species, including but not limited to gadolinium, available for reaction with molten CMAS in high concentrations at the surface of the TBC. The increased concentration of CMAS-reactive species at the surface of the TBC reduces the dissolution depth and thereby time required for the molten CMAS to be sufficiently concentrated with reactive species to form apatite. As discussed further herein, the reactive overlay material can be any apatite-forming material, including but not limited to rare-earth oxides. The reactive overlay is applied to conform to a surface of the TBC including surfaces of internal walls of the TBC formed by columnar gaps open to the TBC surface.

FIG. 1 is a schematic cross-sectional view of a CMAS-resistant TBC system 10 applied to substrate 12. CMAS-resistant TBC system 10 can include bond coat 14, ceramic top coat 16, and CMAS-reactive overlay 18. Substrate 12 can be a nickel- or cobalt-based superalloy, refractory alloy, or ceramic matrix composite (CMC), as contemplated for use in the manufacture of components for a hot section of a gas turbine engine (e.g., combustor panels and turbine blades, blade outer air seals, and stationary vanes). Bond coat 14 can protect substrate 12 from high-temperature oxidation and corrosion and improve adhesion of ceramic top coat 16. Bond coat 14 can be a diffusion or overlay bond coat comprising, for example, an aluminide or MCrAlY (where M can be iron, cobalt, nickel, or a mixture thereof) applied to substrate 12, as known in the art. In some embodiments, a surface of substrate 12 and/or bond coat 14 can be roughened, such as by grit blasting or peening, to improve adhesion of TBC ceramic top coat 16.

Ceramic top coat 16 can include or consist of fully stabilized zirconate/hafnate structures that are phase stable with pure rare earth oxides of CMAS-reactive overlay 18. Fully stabilized zirconate/hafnate structures will have a reduced interaction potential with CMAS-reactive overlay 18. The reduced interaction potential allows a high concentration of the rare earth oxide to remain available in the CMAS-reactive overlay to rapidly dissolve into the molten CMAS and precipitate out stable high melting point phases capable of suppressing further CMAS ingress. Specific chemistries included in ceramic top coat 16 can include pyrochlore/fluorite $A_2B_2O_7$, where A is of the lanthanide+ yttrium group but not necessarily the same as that in the pyrochlore/fluorite (e.g., $Gd_2Zr_2O_7$), as well as delta phase $C_4D_3O_{12}$, where C is of the lanthanide+yttrium group but not necessarily the same as that in the pyrochlore/fluorite (e.g., $Y_4Zr_3O_{12}$).

Ceramic top coat 16 can be deposited on bond coat 14 using any suitable manner to provide a desired microstructure and thickness. Microstructures that provide high strain tolerance can be preferred for high temperature applications. Strain tolerance is generally improved with through-thickness cracks or separations that accommodate thermal expansion. FIG. 1 illustrates a ceramic top coat applied using electron beam physical vapor deposition (EB-PVD), which produces columnar grains 20 that grow vertically from the surface of substrate 12 with featherlike features. The columnar grains can be separated vertically-oriented gaps 22 over a partial or full vertical thickness of the TBC and can be weakly bonded to each other to accommodate thermal stress.

In other embodiments, ceramic top coat 16 can be applied using suspension or solution precursor plasma spray techniques (SPS and SPPS). SPS TBCs have been developed as an alternative to TBCs deposited via EB-PVD. SPS techniques can produce coatings having columnar structures similar to those produced by EB-PVD. Unlike EB-PVD coatings, SPS coatings typically have porous columns, which are formed by randomly oriented particle splats. The columns are generally separated by large through-thickness vertically-oriented inter-columnar gaps. The columnar structures can also have horizontally-oriented inter-pass porosity bands or cracks formed between material deposition passes, which can connect vertically-oriented gaps. The generally large vertically-oriented inter-columnar gaps and inter-pass porosity or cracks can accommodate ingress of molten CMAS through the thickness of the ceramic top coat and into the material matrix, substantially compromising the mechanical stability of the ceramic top coat. Alternative dense, vertically cracked TBCs can also be formed with SPS techniques as well as air plasma spray. Dense, vertically cracked coatings can have a more lamellar-appearing structure with through-thickness cracks formed to relieve stress. While cracks can be narrow, parallel facing surfaces extending through a full or nearly full thickness of the coating can provide a substantially straight pathway for molten CMAS infiltration. As used herein, "vertically-oriented" refers to gaps oriented in a direction extending from an inner surface of the coating or a substrate to an outer surface of the coating and is not limited to gaps extending transverse to the substrate. The orientation of vertically-oriented gaps can typically extend at angles between 45° and 90° from the substrate depending on the deposition method. As used throughout the present Specification and Claims, the term "vertically-oriented gaps" encompasses both "inter-columnar gaps," referring to the spaces formed between columnar structures, and vertically-oriented "cracks" formed between columnar structures or in a dense vertically cracked coating.

The present disclosure is not limited to TBCs with columnar microstructures. The disclosed CMAS-reactive overlay can also be applied to dense or porous ceramic top coats without vertical gaps and applied by any known method, although the use of the disclosed CMAS-reactive overlay is particularly beneficial for coatings susceptible to molten CMAS ingress.

Ceramic top coat 16 can have a single layer or multiple layers of material (not shown) and can include layers of differing chemical composition. For example, ceramic top coat 16 can include an inner yttrium stabilized zirconia (YSZ) layer deposited on bond coat 14 and an outer GDZ layer deposited on the YSZ layer. YSZ has superior thermochemical compatibility with bond coat 14 and high durability, which makes YSZ desirable for TBC applications. Ceramic top coat 16 can have a thickness ranging from 100 to hundreds of microns. For an EB-PVD ceramic top coat, spacing between adjacent vertically-oriented gaps 22 can be smaller than 1 micron. Vertically-oriented gaps 22 can extend from an outer surface of ceramic top coat 16 to a depth in ceramic top coat 16 equal to a partial or full thickness of ceramic top coat 16. Vertically-oriented gaps in dense vertically cracked coatings can be significantly larger than those formed by EB-PVD. Vertically-oriented gaps between columnar microstructures formed using conventional SPS techniques can be significantly larger than those formed in dense vertically cracked coatings, however, advancements in SPS have provided for significantly reduced gap widths including gap widths of less than 5 microns.

CMAS-reactive overlay 18 can be a CMAS-reactive compound that forms a stable high melting point crystalline precipitate reaction product (e.g., apatite) at a rate that is competitive with molten CMAS infiltration kinetics. As used herein, a precipitation rate that is competitive with molten CMAS infiltration kinetics refers to a rate of reaction that is substantially equal to or greater than a rate at which the molten CMAS moves through the coating. As such, the CMAS-reactive overlay 18 reacts with the molten CMAS to form a high melting point crystalline precipitate that can seal vertically-oriented gaps and open porosity and suppress further ingress of molten CMAS. CMAS-reactive compounds capable of suppressing ingress of molten CMAS can include pure rare earth oxides (e.g., $Gd_2O_3$ or $Y_2O_3$), mixed rare earth oxides (e.g., $Gd/Y_2O_3$), and rare earth aluminates (e.g., $Y_4Al_2O_9$ or $Y_3Al_5O_{12}$). The viscosity of CMAS is reduced with increased temperature and therefore consideration of the operation temperature should be considered in selection of the CMAS-reactive material. CMAS-reactive overlay 18 can be a pure rare earth oxide (REO). As used herein, the term "rare earth" refers to elements of the lanthanide series as well as yttrium and scandium. Molten CMAS can react with the REO to form a crystallized oxy-apatite phase based on $RE_8Ca_2(SiO_4)_6O_2$, which can consume the molten CMAS and solidify. Crystalline apatite precipitates can form at a rate greater than the infiltration of molten CMAS within vertically-oriented gaps 22 and can thereby seal vertically-oriented gaps 22 and suppress further infiltration of molten CMAS into ceramic top coat 16.

CMAS-reactive overlay 18 can be applied using atomic layer deposition (ALD), which can form a thin conforming layer of CMAS-reactive material on the surfaces of ceramic top coat 16 and extending into open pores. As illustrated in FIG. 1, CMAS-reactive overlay 18 can conform to the surfaces of the featherlike columnar grains and extend between individual barb-like structures along the length of the columnar grains open to the vertically-oriented gaps between adjacent columnar grains. The use of ALD can provide a uniform surface coverage that allows the CMAS-reactive overlay material to move deeper into inner surfaces of the structure. The thin layer of CMAS-reactive overlay 18 can provide a sufficient concentration of the reactive rare earth element without closing gaps 22 between adjacent columnar grains. As such, the TBC strain tolerance can be maintained with the deposition of CMAS-reactive overlay 18.

The thickness of CMAS-reactive overlay can vary depending on the size of vertically-oriented gaps 22. For the EB-PVD coating illustrated in FIG. 1, having an average gap width of approximately 1 micron, CMAS-reactive overlay 18 can have a thickness generally ranging from 100 to 500 nanometers. In some embodiments, and particularly for coatings with very narrow gaps 22, CMAS-reactive overlay 18 can be less than 100 nanometers and as low as 10 nanometers. CMAS-reactive overlay 18 can be applied with a thickness sufficient to limit molten CMAS ingress to a small fraction of the coating thickness. The thickness of CMAS-reactive overlay 18 can be greater for ceramic top coats having larger vertically-oriented gaps (e.g., ceramic top coats applied by plasma spray techniques). CMAS-reactive overlay 18 can extend a partial to nearly full thickness of ceramic top coat 16. To avoid interaction with bond coat 14 and/or substrate 12, it may be desirable to maintain separation between CMAS-reactive overlay 18 and bond coat 14. In some embodiments, CMAS-reactive overlay can extend one-third of the thickness of ceramic top coat 16 from the outer surface. Preferably, CMAS-reactive overlay 18 can extend half of the thickness of ceramic top coat 16.

While ALD is a preferred deposition method for the disclosed EB-PVD coating, given the capability of ALD to form a thin conforming coating layer that can extend deep into open pores, other chemical vapor deposition (CVD) or coating methods may be suitable for some TBC systems. The deposition method must be capable of providing sufficient reacting species near the surface of the coating, and including surfaces separated by vertically-oriented gaps, to compete with a CMAS infiltration rate and thereby provide sufficient protection from CMAS ingress. To maintain strain tolerance, the deposition method should not fill vertically-oriented gaps.

Figure 2:
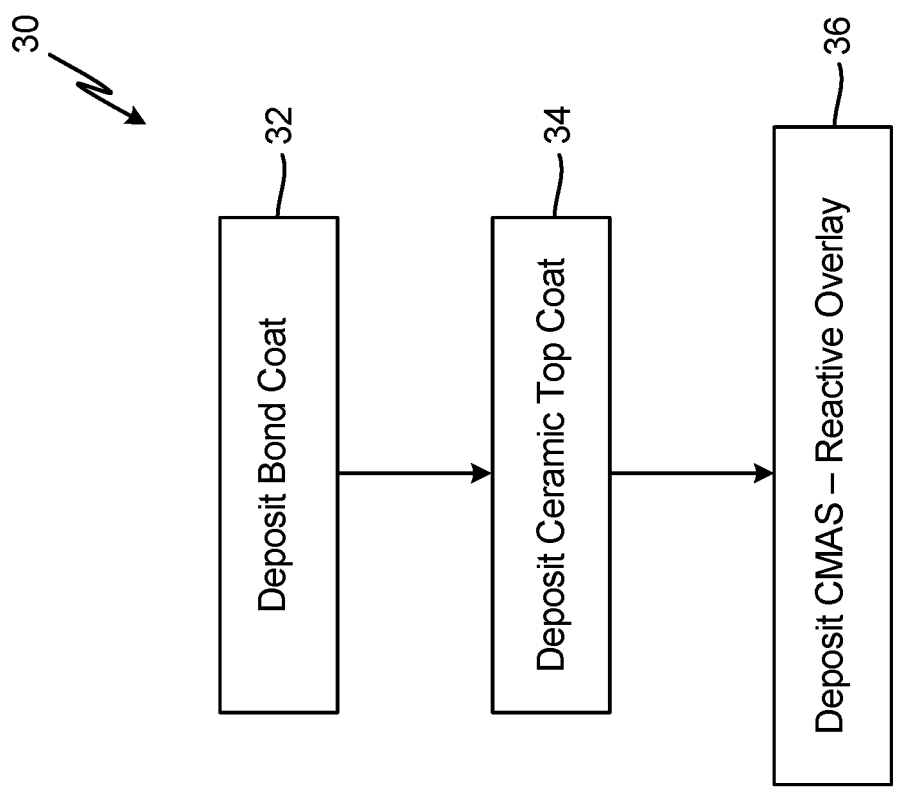
FIG. 2 is a flowchart of a method for applying a coating to a component according to one embodiment.

FIG. 2 illustrates a flowchart of method 30 for applying CMAS-reactive TBC system 10 to a component according to one disclosed non-limiting embodiment. It should be appreciated that alternative and additional steps may be provided without departing from the teaching herein.

Metallic bond coat 14 is deposited on substrate 12 in step 32. Metallic bond coat 14 provides environmental protection for substrate 12 against oxidation, corrosion and improved adhesion along with a thermally grown oxide for ceramic top coat 16. Typically, metallic bond coat 14 can be an MCrAlY material applied via low pressure plasma spray, however, other bond coat materials and deposition methods may be used. Metallic bond coat 14 can generally have a thickness ranging from 50 to several hundred microns.

Ceramic top coat 16 can be deposited on metallic bond coat 14 in step 34. In some embodiments, the surface of bond coat 14 can first be prepared for ceramic top coat deposition (e.g., contaminants can be removed and the surface can be grit blasted to provide a desired surface roughness). Ceramic top coat 16 can be applied using any of a variety of deposition techniques used to provide a desired microstructure (e.g., desired porosity and vertically-oriented gaps). Preferably, ceramic top coat 16 can be deposited in a manner that provides vertically-oriented gaps to provide needed strain tolerance during operation. EB-PVD can provide very narrow vertically-oriented gaps (approximate 1 micron), which can provide high strain tolerance and which can be easily sealed near an upper surface of the coating to limit CMAS-ingress to a small fraction of the coating thickness. SPS can also be used to form coatings with columnar microstructures and vertically-oriented gaps. SPS as well as air plasma spraying techniques can be used to form dense vertically-cracked coatings. In some embodiments, ceramic top coat 16 can be substantially free of vertically-oriented gaps.

Ceramic top coat 16 can typically have a thickness ranging from 100 to several hundred microns depending on the application. Ceramic top coat 16 can be fully stabilized zirconate/hafnate structures that are phase stable with pure rare earth oxides of the CMAS-reactive overlay 18. In some embodiments, ceramic top coat 16 can have layers of differing chemical compositions. For example, ceramic top coat 16 can have a YSZ inner layer and fully stabilized zirconate/hafnate composition outer layer.

CMAS-reactive overlay 18 is applied to ceramic top coat 16 in step 36. In some embodiments, additional surface treatment of ceramic top coat 16 can be provided to prepare ceramic top coat 16. For example, thermal exposure can be used to burn off deleterious organics. CMAS-reactive overlay 18 can be a pure REO capable of forming a high melting point crystalline precipitate upon reaction with molten CMAS.

CMAS-reactive overlay 18 can be applied via ALD to form a thin conforming layer over surfaces of ceramic top coat 16, including deep into open pores of the microstructure. In other embodiments, CMAS-reactive overlay 18 can be applied by other CVD or physical deposition methods (e.g., dipping). CMAS-reactive overlay 18 is applied to provide a sufficient concentration of CMAS reactive species to be able to suppress CMAS ingress. CMAS-reactive overlay 18 is applied with a thickness that can maintain vertically-oriented gaps while also being capable of limiting molten CMAS ingress to a small fraction of the coating thickness. Typically, for an EB-PVD ceramic top coat, CMAS-reactive overlay 18 can have a thickness of 500 nanometers or less. The thickness can increase for ceramic top coats with larger gap sizes.

The concentrated rare earth overlay applied to the ceramic TBC in a thin conforming layer can suppress molten CMAS ingress during operation while maintaining strain tolerance of the TBC. The increased concentration of CMAS-reactive species at the surface of the TBC reduces the dissolution depth and thereby time required for the molten CMAS to be sufficiently concentrated with reactive species to form a high melting point crystalline precipitate, which seals the TBC from further molten CMAS infiltration.

Summation

Any relative terms or terms of degree used herein, such as "substantially", "essentially", "generally", "approximately" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, transient alignment or shape variations induced by thermal, rotational or vibrational operational conditions, and the like. Moreover, any relative terms or terms of degree used herein should be interpreted to encompass a range that expressly includes the designated quality, characteristic, parameter or value, without variation, as if no qualifying relative term or term of degree were utilized in the given disclosure or recitation.

DISCUSSION OF POSSIBLE EMBODIMENTS

The following are non-exclusive descriptions of possible embodiments of the present invention.

A calcium-magnesium-alumino-silicate (CMAS)-reactive thermal barrier coating includes a ceramic coating and a CMAS-reactive overlay coating. The CMAS-reactive overlay coating conforms to a surface of the ceramic coating and comprises a compound that forms a stable high melting point crystalline precipitate when reacted with molten CMAS at a rate that is competitive with CMAS infiltration kinetics into the thermal barrier coating. The ceramic coating phase is stable with the CMAS-reactive overlay coating.

The CMAS-reactive thermal barrier coating of the preceding paragraph can optionally include, additionally and/or alternatively, any one or more of the following features, configurations and/or additional components:

The CMAS-reactive thermal barrier coating of the preceding paragraph, wherein the CMAS-reactive overlay coating can comprises a material selected from a group consisting of a pure rare earth oxide and a mixed rare earth oxide.

The CMAS-reactive thermal barrier coating of any of the preceding paragraphs, wherein the CMAS-reactive overlay coating can be a rare earth aluminate.

The CMAS-reactive thermal barrier coating of any of the preceding paragraphs, wherein the ceramic coating can comprise a fully stabilized zirconate or hafnate structure.

The CMAS-reactive thermal barrier coating of any of the preceding paragraphs, wherein the ceramic coating can comprise gadolinium zirconate.

The CMAS-reactive thermal barrier coating of any of the preceding paragraphs, wherein the ceramic coating can comprise yttrium zirconate.

The CMAS-reactive thermal barrier coating of any of the preceding paragraphs, wherein the ceramic coating can comprise a plurality of vertically-oriented gaps and wherein the CMAS-reactive overlay coating can extend into the gaps and is deposited on inner walls of the ceramic coating, and wherein the plurality of vertically-oriented gaps can remain open.

The CMAS-reactive thermal barrier coating of any of the preceding paragraphs, wherein the CMAS-reactive overlay can be deposited in pores open to the vertically-oriented gaps.

The CMAS-reactive thermal barrier coating of any of the preceding paragraphs, wherein the thickness of the CMAS-reactive overlay can range from 10 to 500 nanometers.

The CMAS-reactive thermal barrier coating of any of the preceding paragraphs, wherein the CMAS-reactive overlay can extend into the vertically-oriented gaps to a depth of at least one-third of a thickness of the ceramic coating from an outer surface of the ceramic coating.

The CMAS-reactive thermal barrier coating of any of the preceding paragraphs, wherein the CMAS-reactive overlay can extend into the vertically-oriented gaps to a depth of at least one-half of a thickness of the ceramic coating from an outer surface of the ceramic coating.

The CMAS-reactive thermal barrier coating of any of the preceding paragraphs, wherein the CMAS-reactive overlay can have a material composition that will react with molten CMAS to form an oxy-apatite phase.

A method of forming a CMAS-reactive thermal barrier coating includes depositing a ceramic coating on a substrate and depositing a CMAS-reactive overlay on the ceramic coating. The CMAS-reactive overlay coating conforms to a surface of the ceramic coating and comprises a compound that forms a stable high melting point crystalline precipitate when reacted with molten CMAS at a rate that is competitive with CMAS infiltration kinetics into the thermal barrier coating. The ceramic coating phase is stable with the CMAS-reactive overlay coating.

The method of the preceding paragraph can optionally include, additionally and/or alternatively, any one or more of the following features, configurations, additional components, and/or steps:

The method of the preceding paragraph, wherein the CMAS-reactive overlay can be deposited using atomic layer deposition.

The method of any of the preceding paragraphs, wherein the ceramic coating can be applied by electron beam-physical vapor deposition.

The method of any of the preceding paragraphs, wherein the ceramic coating can comprise a plurality of vertically-oriented columnar microstructures extending in a thickness direction of the ceramic coating and wherein the CMAS-reactive overlay can conform to surfaces along a length of the columnar microstructures, and wherein the CMAS-reactive overlay can extend into the vertically-oriented gaps to a depth of at least one-third of a thickness of the ceramic coating from an outer surface of the ceramic coating.

The method of any of the preceding paragraphs, wherein the CMAS-reactive overlay can have a thickness ranging from 10 to 500 nanometers.

The method of any of the preceding paragraphs, wherein the plurality of vertically-oriented columnar microstructures can be separated by a plurality of vertically-oriented gaps and wherein the gaps can remain open to a surface of the coating follow deposition of the CMAS-reactive overlay.

The method of any of the preceding paragraphs, wherein the CMAS-reactive overlay coating can include a material selected from a group consisting of a pure rare earth oxide, a mixed rare earth oxide, and a rare earth aluminate.

The method of any of the preceding paragraphs, wherein the ceramic coating can comprise a fully stabilized zirconate or hafnate structure.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A calcium-magnesium-alumino-silicate (CMAS)-reactive thermal barrier coating comprising:
    a ceramic coating comprising a plurality of featherlike columnar grains separated by vertically-oriented gaps open to an outer surface, wherein the ceramic coating comprises a fully stabilized zirconate or hafnate structure; and
    a CMAS-reactive overlay coating forming a conformal layer with uniform surface coverage on surfaces of the featherlike grains extending into the vertically-oriented gaps, wherein the vertically-oriented gaps remain open to the outer surface, and wherein the CMAS-reactive overlay coating comprises a compound selected from a group consisting of a pure rare earth oxide and a mixed rare earth oxide that forms a crystalline precipitate when reacted with molten CMAS at a rate substantially equal to or greater than a rate at which the molten CMAS infiltrates through the thermal barrier coating;
    wherein the ceramic coating is phase stable with the CMAS-reactive overlay coating.

2. The CMAS-reactive thermal barrier coating of claim 1, wherein the ceramic coating comprises gadolinium zirconate.

3. The CMAS-reactive thermal barrier coating of claim 1, wherein the ceramic coating comprises yttrium zirconate.

4. The CMAS-reactive thermal barrier coating of claim 1, wherein the CMAS-reactive overlay is deposited in pores open to the vertically-oriented gaps.

5. The CMAS-reactive thermal barrier coating of claim 4, wherein the thickness of the CMAS-reactive overlay ranges from 10 to 500 nanometers.

6. The CMAS-reactive thermal barrier coating of claim 4, wherein the CMAS-reactive overlay extends into the vertically-oriented gaps to a depth of at least one-third of a thickness of the ceramic coating from the outer surface of the ceramic coating.

7. The CMAS-reactive thermal barrier coating of claim 6, wherein the CMAS-reactive overlay extends into the vertically-oriented gaps to a depth of at least one-half of a thickness of the ceramic coating from an outer surface of the ceramic coating.

8. The CMAS-reactive thermal barrier coating of claim 1, wherein the CMAS-reactive overlay has a material composition that will react with molten CMAS to form an oxyapatite phase.

* * * * *